(12) United States Patent
Du et al.

(10) Patent No.: US 8,344,760 B2
(45) Date of Patent: Jan. 1, 2013

(54) INPUT/OUTPUT BUFFER CIRCUIT

(75) Inventors: Yamin Du, Toronto (CA); Oleg Drapkin, Richmond Hill (CA); Grigori Temkine, Markham (CA)

(73) Assignee: ATI Technologies ULC, Markham, Ontario (CA)

(*) Notice: Subject to any disclaimer, the term of this patent is extended or adjusted under 35 U.S.C. 154(b) by 0 days.

(21) Appl. No.: 12/505,274

(22) Filed: Jul. 17, 2009

(65) Prior Publication Data

US 2010/0176848 A1 Jul. 15, 2010

Related U.S. Application Data

(60) Provisional application No. 61/081,515, filed on Jul. 17, 2008.

(51) Int. Cl.
*H03K 3/00* (2006.01)
(52) U.S. Cl. ........................................................ 327/108
(58) Field of Classification Search ........................ None
See application file for complete search history.

(56) References Cited

U.S. PATENT DOCUMENTS

| | | | |
|---|---|---|---|
| 5,293,082 A * | 3/1994 | Bathaee | 327/108 |
| 5,300,832 A | 4/1994 | Rogers | |
| 5,467,031 A | 11/1995 | Nguyen et al. | |
| 5,510,731 A | 4/1996 | Dingwall | |
| 5,534,811 A | 7/1996 | Gist et al. | |
| 5,723,987 A | 3/1998 | Ronen | |
| 5,736,869 A | 4/1998 | Wei | |
| 5,821,800 A | 10/1998 | Le et al. | |
| 5,852,540 A | 12/1998 | Haider | |
| 5,923,202 A | 7/1999 | Merrill | |
| 5,933,025 A | 8/1999 | Nance et al. | |
| 5,966,030 A | 10/1999 | Schmitt et al. | |
| 5,969,541 A | 10/1999 | Waggoner | |
| 6,008,665 A | 12/1999 | Kalb et al. | |
| 6,049,445 A | 4/2000 | Gauthier, Jr. et al. | |
| 6,064,227 A | 5/2000 | Saito | |
| 6,064,229 A | 5/2000 | Morris | |
| 6,130,557 A | 10/2000 | Drapkin et al. | |
| 6,373,282 B1 | 4/2002 | Drapkin et al. | |
| 6,400,546 B1 | 6/2002 | Drapkin et al. | |
| 2003/0071663 A1 * | 4/2003 | Taguchi et al. | 327/112 |
| 2007/0024328 A1 * | 2/2007 | Shin | 327/112 |
| 2009/0167368 A1 * | 7/2009 | Chan et al. | 327/108 |
| 2009/0230997 A1 * | 9/2009 | Kwon et al. | 327/108 |
| 2010/0271118 A1 * | 10/2010 | Bhattacharya et al. | 327/543 |

FOREIGN PATENT DOCUMENTS

DE 19738181 A1 9/1998
(Continued)

OTHER PUBLICATIONS

EP Search Report; EP Application No. 00307497.8; dated Dec. 18, 2000.
Weste, Neil H.E. et al.; Principles of CMOS VLS Design; Addison-Wesley Publishing Company, Second Edition; p. 365; 1993.
EP Search Report; EP Application No. 00306939.0 dated Aug. 11, 2000.

(Continued)

*Primary Examiner* — Lincoln Donovan
*Assistant Examiner* — Khareem E Almo
(74) *Attorney, Agent, or Firm* — Faegre Baker Daniels LLP

(57) ABSTRACT

A circuit includes an input/output buffer circuit. The input/output buffer circuit includes an output buffer circuit and a bias control circuit. The output buffer circuit provides an output voltage in response to output information. The bias control circuit provides an output buffer bias voltage based on the output voltage.

23 Claims, 13 Drawing Sheets

FOREIGN PATENT DOCUMENTS

| | | |
|---|---|---|
| EP | 0848498 A1 | 6/1998 |
| EP | 0961206 A2 | 12/1999 |
| GB | 2313968 A | 12/1997 |
| WO | 95/19657 | 7/1995 |
| WO | 98/32228 | 7/1998 |

OTHER PUBLICATIONS

Patent Abstracts of Japan; vol. 1998; No. 09; Jul. 31, 1998; Publication No. 10105307; published Apr. 24, 1998.

* cited by examiner

INPUT/OUTPUT BUFFER CIRCUIT

CROSS-REFERENCE TO RELATED APPLICATION

The present patent application claims priority from and the benefit of U.S. Provisional Patent Application No. 61/081, 515, filed Jul. 17, 2008, and entitled INPUT/OUTPUT BUFFER WITH MULTI-FUNCTION OPERATION AND HIGH VOLTAGE TOLERANCE, which is hereby incorporated herein by reference in its entirety.

FIELD

This disclosure generally relates to input/output buffer circuits, and more particularly, to input/output buffer circuits capable of interfacing with other circuits operating using different supply voltages.

BACKGROUND

Advancements in technology continue to create challenges in designing smaller, faster and more complicated integrated circuits having increased functionality. Some integrated circuits, such as an input/output pad configuration, can include input/output buffers circuits having input/output pins (e.g., input/output nodes) that interface with external components. In some embodiments, the input/output buffers circuits may operate at different supply voltages than the external components. For example, dimensions of modern transistors have been scaled down (e.g., to nanometer regions) and operate using decreased supply voltages such as 1.8 volts or less. However, external electrical systems or components that interface with the input/output pad may operate using a higher supply voltage such as 5 volts, for example. Therefore, it is desirable for input/output circuits to tolerate higher voltages and to interact with various external circuits or devices operating at different voltages than the input/output circuits.

One solution is to include voltage level shifters operating a higher voltages on a PC board external to an integrated circuit having the input/output circuit in order to tolerate the higher voltage supply. However, this solution requires extra space due to the external voltage level shifters, which can increase cost. In addition, by using multiple external voltage level shifters on a PC board, power consumption is increased, which is also undesirable.

Furthermore, known integrated circuits are typically designed to include a different I/O pad dedicated for each separate functions. For example, a series of dedicated I/O pads may be designed to interface with open drain interfaces (e.g., Display Data Channel (DDC) interfaces), other I/O pads are designed to be dedicated to interface with low swing output interfaces (e.g., Display Port Auxiliary (DP AUX) interfaces), still other I/O pads are dedicated to interface with rail to rail output circuits (e.g., general purpose input/output pads).

As such, a need exists for an improved input/output buffer configuration that can not only tolerate higher voltages, but can also support multiple functions through a single I/O pad configuration.

BRIEF DESCRIPTION OF THE DRAWINGS

The disclosure will be more readily understood in view of the following description when accompanied by the below figures, wherein like reference numerals represent like elements.

DETAILED DESCRIPTION

Figure 1:
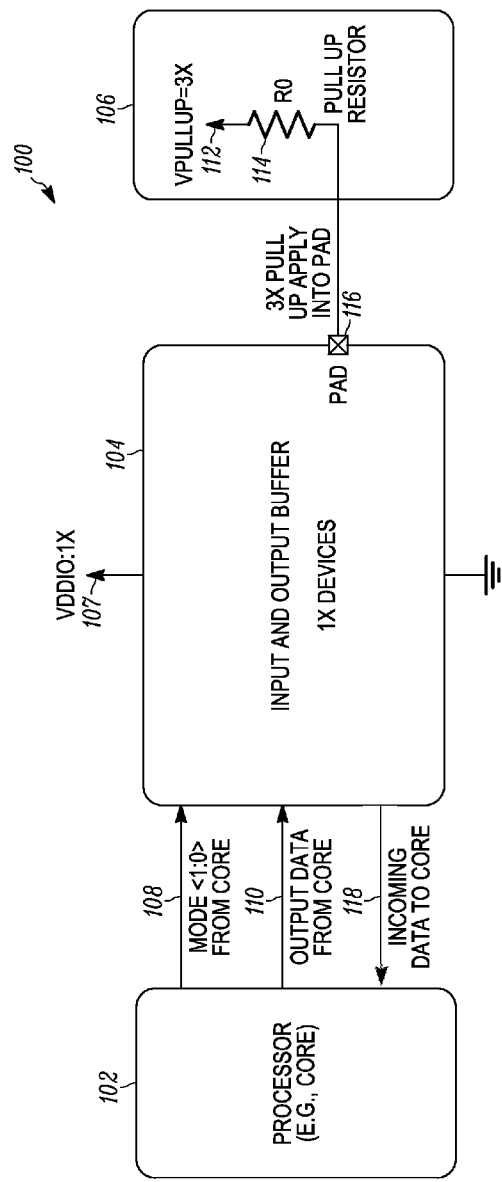
FIG. 1 is an exemplary functional block diagram of an apparatus having an input/output buffer circuit according to the present disclosure.

In one example, a circuit includes an input/output buffer circuit. The input/output buffer circuit includes an output buffer circuit and a bias control circuit. The output buffer circuit provides an output voltage in response to output information. The bias control circuit provides an output buffer bias voltage based on the output voltage.

The circuit provides, among other advantages, tolerance to higher voltages on, for example, an input/output pad without the need for external level shifters. In addition, the circuit has a single I/O pad that can be configured to support multiple functions, such as three functions for example. Other advantages will be recognized by those of ordinary skill in the art.

In one example, the bias control circuit includes a pull up control circuit and a dynamic bias circuit. The dynamic bias circuit provides a first bias voltage of the output buffer bias voltage based on the output voltage. The pull up control circuit provides a second bias voltage of the output buffer bias voltage based on the first bias voltage and/or the output voltage. The output voltage is based on the first bias voltage, the second bias voltage, and/or the output information.

In one example, the input/output buffer circuit is configured to be powered by a first voltage. The input/output buffer circuit selectively operates at least a first mode, a second mode, or a third mode in response to a mode control signal. A second voltage of the input/output node is greater than the first voltage when in the first mode. The second voltage of the input/output node is approximately equal to the first voltage when in the second mode. The second voltage of the input/output node is less than the first voltage when in the third mode.

In one example, the output buffer circuit includes a pull up buffer circuit and a pull down buffer circuit. The pull up buffer circuit provides the output voltage based on the second bias voltage. The pull down buffer circuit provides the second voltage based on the output voltage, which is based on the first bias voltage.

In one example, the circuit includes a level shifter circuit. The level shifter circuit provides input information in response to the output voltage and the output buffer bias voltage. In one example, the first bias voltage varies between the first voltage and twice the first voltage when in the first mode. The second bias voltage is approximately equal to the first voltage when in the second mode and the third mode. In one example, the second bias voltage varies between the first voltage and twice the first voltage when in the first mode and/or the second bias voltage is approximately equal to the first voltage when in the first mode.

In one example, the circuit is an integrated circuit. The circuit includes at least one processor that provides the mode control signal and the output information. In one example, an apparatus includes the circuit.

In one example, a computer readable medium includes information that when executed by a processor causes the processor to operate, design, and/or organize the circuit.

As used herein, the term "circuit" can include an electronic circuit, one or more processors (e.g., shared, dedicated, or group of processors such as but not limited to microprocessors, DSPs, or central processing units) and memory that execute one or more software or firmware programs, combinational logic circuits, an ASIC, and/or other suitable components that provide the described functionality. Unless otherwise stated, the term "powered off" refers to removing (or lowering) the source power of a "circuit" and/or "device" rendering it inoperative and/or the "circuit" and/or "device" transitioning into a mode of operation that consumes less power than when in a normal mode of operation. In addition, the term "powered on" refers to adding (or increasing) the source power of a "circuit" and/or "device" rendering it operative and/or the "circuit" and/or "device" transitioning into a normal mode of operation from a mode of operation that consumes less power than the normal mode of operation. Additionally, the term "signal" may refer to one or more currents, one or more voltages, or a data signal. Furthermore, as will be appreciated by those of ordinary skill in the art, the operation, design, and organization, of a "circuit" can be described in a hardware description language such as Verilog™, VHDL, or other suitable hardware description languages.

Referring now to FIG. 1, an exemplary functional block diagram of an apparatus 100 is depicted. The apparatus 100 includes a processor 102 (or processor core), an input/output buffer circuit 104, and, in some embodiments, an external pull up circuit 106. The input/output buffer circuit 104 is powered by a first voltage source 107 (e.g., 1X power with 1X voltage sources or supplies). As such, in this example, the circuitry (e.g., transistors) of the input/output buffer circuit 104 can handle 1X and less than 1X voltage level input and output signals. Accordingly, each transistor can only withstand a 1X voltage between its drain and source, drain and gate, and source and gate.

During operation, the input/output buffer circuit 104 receives a mode control signal 108 and processor output information 110 (e.g., processor output data) from the processor 102. In response thereto, the input/output buffer circuit 104 selectively operates in a first mode, a second mode, or a third mode. In one embodiment, the input/output buffer circuit 104 can interact with external circuits or devices operating at a higher voltage level (e.g., greater than 1X) when in the first mode. The input/output buffer circuit 104 can interact with external circuits or devices operating at voltage level approximately equal to that of the first voltage source 107 (e.g., 1X±10%) when in the second mode. The input/output buffer circuit 104 can interact with external circuits or devices operating at a lower voltage level (e.g., less than 1X) when in the third mode. As such, the input/output buffer circuit 104 can interact with open drain interfaces, such as Display Data Channel (DDC), when in the first mode. The input/output buffer circuit 104 can interact with low swing output interfaces, such as Display Port Auxiliary (DP AUX), when in the second mode. The input/output buffer circuit 104 can interact with rail to rail output interfaces, such as general purpose input/output pads, when in the third mode.

When in the first mode, the external pull up circuit 106 can be powered by a voltage source 112 that is higher than voltage source 107. For example, in one embodiment, voltage source 112 can supply a 3X voltage level (e.g., three times greater than power source 107) although other values are contemplated. The external pull up circuit 106 includes a resistor 114 between voltage source 112 and input/output node 116 (e.g., input/output pad). In one embodiment, the resistor 114 can have a resistance value between 1-10 kOhms. The external pull up circuit 106 pulls up the output of the input/output node 116 to the level of voltage source 112 in order to interface with other circuits or devices operating at the same voltage level as voltage source 112.

In addition, the input/output buffer circuit 104 provides input information 118 to the processor 102 based on a voltage of the input/output node 116. For example, when in the first mode, the input/output buffer circuit 104 receives information from an external circuit or device operating at the higher voltage (e.g., 3X) and provides the input information 118 to the processor 102 at the voltage level of the processor 102 (e.g., 1X).

Figure 2:
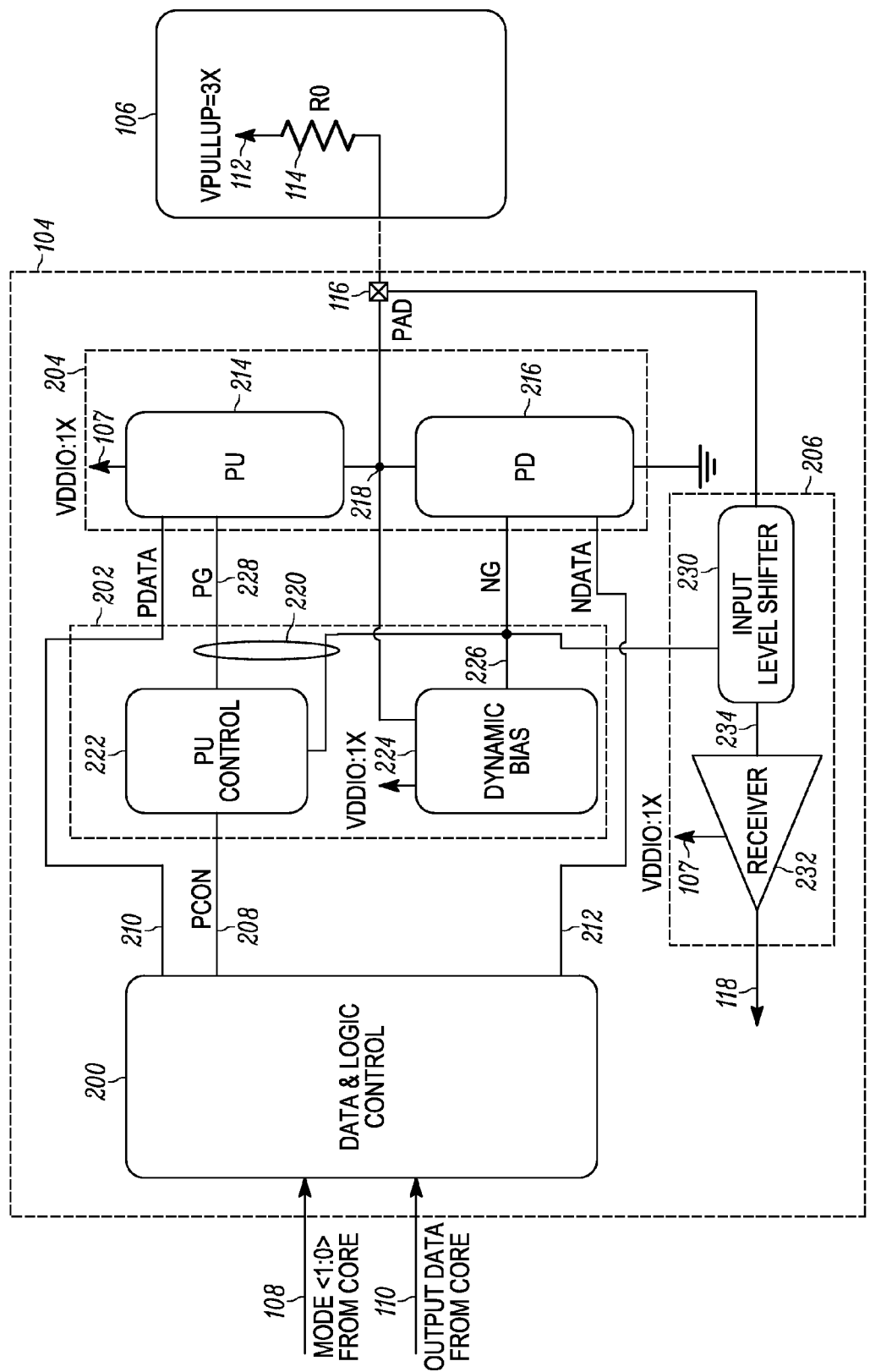
FIG. 2 is an exemplary functional block diagram of the input/output buffer circuit.

Referring now to FIG. 2, an exemplary functional block diagram of the input/output buffer circuit 104 is depicted. The input/output buffer circuit 104 includes a data and logic control circuit 200, a bias control circuit 202, an output buffer circuit 204, and an input circuit 206. The data and logic control circuit 200 provides a control signal 208 in response to the mode control signal 108. In addition, the data and logic control circuit 200 provides output information 210, 212 (e.g., output data) to the output buffer circuit 204 in response to the processor output information 110. In this example, the output information 210, 212 includes first output information 210 that is provided to a pull up buffer circuit 214 of the output buffer circuit 204 and second output information 212 that is provided to a pull down buffer circuit 216 of the output buffer circuit 204.

The output buffer circuit 204 provides an output voltage 218 in response to the output information 210, 212. The bias control circuit 202 provides an output buffer bias voltage 220 based on an output voltage 218 of the output buffer circuit 204. The output buffer bias voltage 220 varies based on the output voltage 218 in order to vary biasing of the output buffer circuit 204. As such, the input/output buffer circuit 104 uses the output voltage 218 as feedback to bias the output buffer circuit 204 in order to compensate for the voltage level of voltage source 112.

In one example, when in the first mode, voltage source 107 can be powered off and the output buffer bias voltage 220 can be generated internally from voltage source 112 of the external pull up circuit 106 in order to protect circuitry of the input/output buffer circuit 104 that can only withstand voltage levels equivalent to that of power source 107.

The bias control circuit 202 includes a pull up control circuit 222 and a dynamic bias circuit 224. The dynamic bias circuit 224 provides a first bias voltage 226 of the output buffer bias voltage 220 based on the output voltage 218. The pull up control circuit 222 provides a second bias voltage 228 of the output buffer bias voltage 220 based on the first bias voltage 226. The first bias voltage 226 biases the pull down buffer circuit 216 and the second bias voltage 228 biases the pull up buffer circuit 214. As such, the output voltage 218 is based on the first bias voltage 226, the second output voltage 228, and the output information 210, 212.

The input circuit 206 includes a level shifter circuit 230 and a receiver circuit 232. The level shifter circuit 230 receives information at the input/output node 116, which is at the output voltage 218 level corresponding to voltage source 112 and shifts the information to a voltage level corresponding with the processor 102 (e.g., 1X). As discussed in more detail below, the level shifter circuit 230 provides information 234 at the voltage level corresponding with the processor 102 based on the output voltage 218 and the first bias voltage 226 of the output buffer bias voltage 220. The receiver 232, which can comprise any suitable buffer circuitry, provides the input information 118 to the processor 102 in response to the information 234 at the voltage level corresponding with the processor 102.

Figure 3:
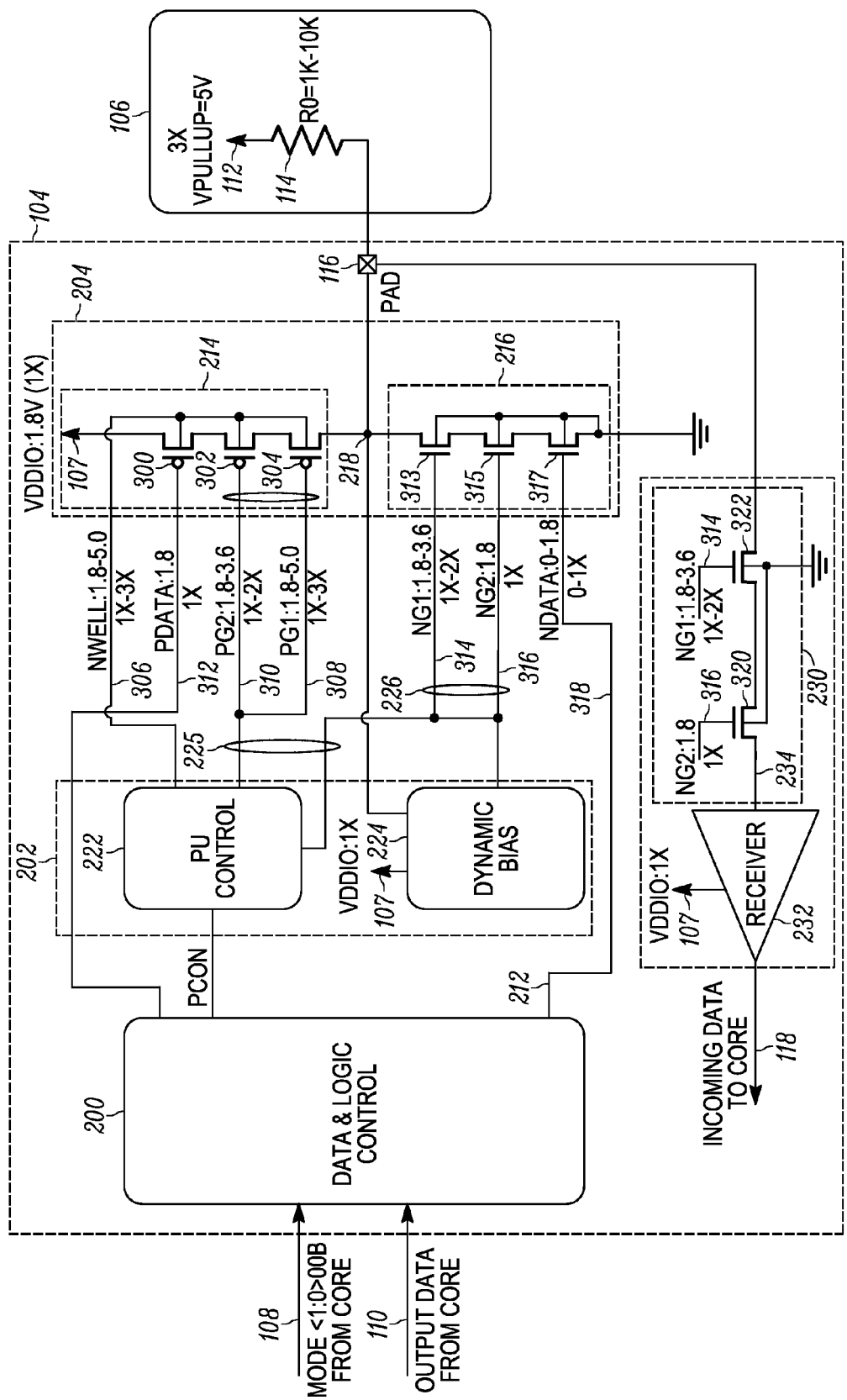
FIG. 3 is an exemplary depiction of the input/output buffer circuit operating in an open drain mode.

Referring now to FIG. 3, an exemplary depiction of the input/output buffer circuit 104 operating in the first mode (e.g., open drain interface) is depicted. In this example, the input/output buffer circuit 104 includes 1X circuitry. The external pull up circuit 106 interfaces with 3X circuitry of another circuit (not shown). Each transistor of the input/output buffer circuit 104 can only withstand a 1X voltage between its drain and source, drain and gate, and source and gate.

When the 3X external pull up circuit 106 is on and voltage source 107 in not supplying power to the input/output buffer circuit 104 (e.g., 1X power is off), 1X and 2X bias voltages of the output buffer bias voltage 220 are generated internally from the 3X external pull up circuit 106 in order to protect the 1X circuitry of the input/output buffer circuit 104. When the voltage source 107 is supplying power to the input/output buffer circuit 104 (e.g., 1X power is on), only the 2X bias voltage of the output buffer bias voltage 220 is generated from the 3X external pull up circuit 106 while the 1X bias voltage output buffer bias voltage 220 is provided derived from voltage source 107. In addition, the N-well of the pull up buffer circuit 214 floats due to the 3X external pull up being greater than voltage source 107 (e.g., 1X). As such, in this example, the input/output buffer circuit 104 is 3X voltage level tolerant.

In this example, the pull up buffer circuit 214 includes a first PMOS transistor 300, second PMOS transistor 302, and third PMOS transistor 304 arranged in a cascode configuration as shown. As shown, in this example, N-well voltage 306 varies between the voltage level of voltage source 107 and voltage source 112 (e.g., between 1X and 3X). PG1 voltage 308 of the second bias voltage 228 varies between the voltage level of voltage source 107 and voltage source 112 (e.g., between 1X and 3X). PG2 voltage 310 of the second bias voltage 228 varies between the voltage level of voltage source 107 and twice the voltage level of voltage source 107 (e.g., between 1X and 2X). More specifically, PG1 voltage 308, PG2 voltage 310 and Nwell voltage 306 dynamically trace the output voltage 218 to prevent the circuitry of the input/output buffer circuit 104 from suffering from overstress voltage (e.g., more than 1X voltage). For example, when the output voltage 218 goes to 5V, the PG1 voltage 308 and Nwell 306 dynamically follow the output voltage 218 to 5V by following pad voltage level. Similarly, the PG2 voltage 310 goes to 3.6V by following the NG1 voltage 226. Pdata voltage 312 remains constant at the voltage level of voltage source 107 (e.g., 1X).

The pull down buffer circuit 216 214 includes a first NMOS transistor 313, second NMOS transistor 315, and third NMOS transistor 317 arranged in a cascode configuration. As shown, NG1 voltage 314 of the first bias voltage 226 varies between the voltage level of voltage source 107 and twice the voltage level of voltage source 107 (e.g., between 1X and 2X). More specifically, the NG1 voltage 314 dynamically traces the output voltage 218. For example, when the output voltage 218 goes to 5V, the NG1 voltage 314 goes to 3.6V and when output voltage 218 goes to 0V, the NG1 voltage 314 goes to 1.8V.

NG2 voltage 316 remains constant at the voltage level of voltage source 107 (e.g., 1X). Ndata voltage 318 of the second output information 212 varies between the voltage level of voltage source 107 and twice the voltage level of voltage source 107 (e.g., between 1X and 2X). In addition, the level shifter circuit 230 includes a first transistor 320 and a second transistor 322 arranged as shown.

As noted above, the second bias voltage 228 biases the pull up buffer circuit 214 while the first bias voltage 226 biases the pull down buffer circuit 216. More specifically, the second bias voltage 228 biases PMOS transistors 300, 302, 304 and the first bias voltage 226 biases NMOS transistors 313, 315, 317. Furthermore, the dynamic bias circuit 224 for generates 1X and 2X bias voltages. The pull up control circuit 222 biases the Nwell voltage 306.

Figure 4:
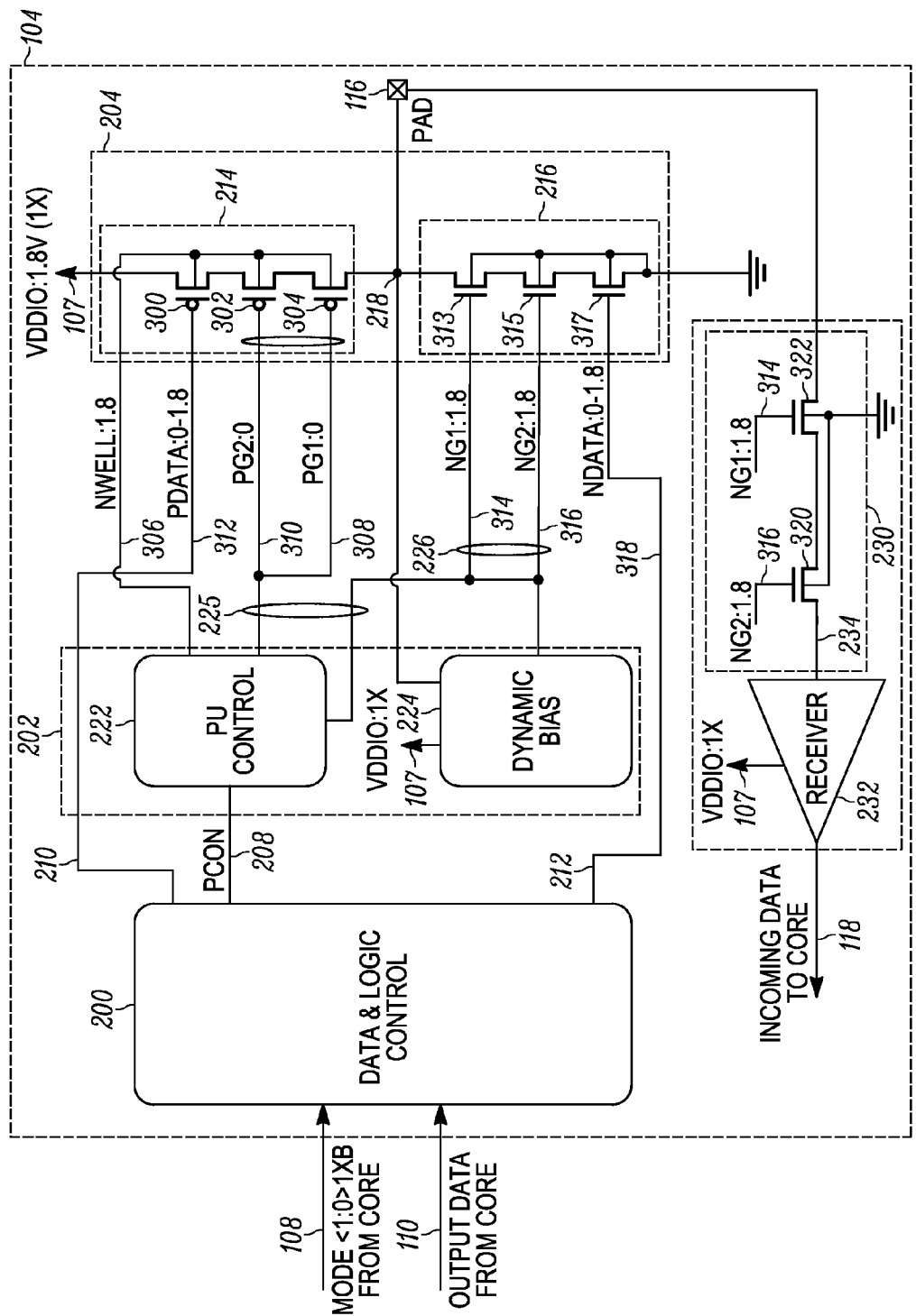
FIG. 4 is an exemplary diagram of the input/output buffer circuit operating a rail to rail mode.

Referring now to FIG. 4, an exemplary diagram of the input/output buffer circuit 104 operating the second mode (e.g., a rail to rail output mode) is depicted. In this example, the output voltage 218 varies from 0 to 1X Volts (e.g., 0 to 1.8V). As such, the NG1 voltage 314, the NG2 voltage 316, and the Nwell voltage 306 are constant at 1X Volts (e.g. 1.8V) and the PG1 voltage 308 and the PG2 voltage 310 are at 0. In addition, the Pdata voltage 312 and the Ndata voltage 318 vary between 0 and 1X Volts (e.g., 0-1.8V).

Figure 5:
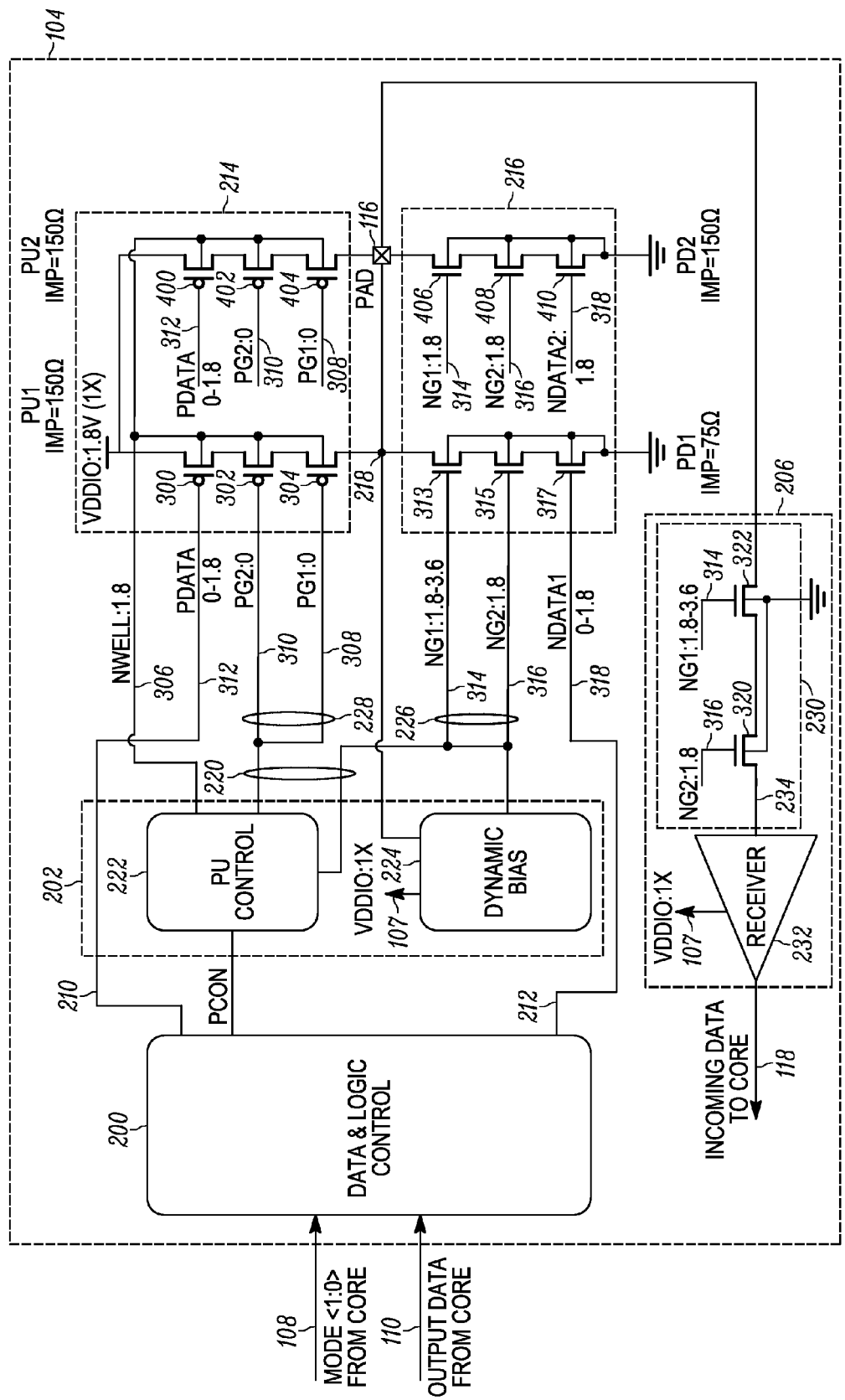
FIG. 5 is an exemplary diagram of the input/output buffer circuit operating a low swing output mode.

Referring now to FIG. 5, an exemplary diagram of the input/output buffer circuit 104 operating the third mode (e.g., a low swing output mode) is depicted. In this example, the pull up buffer circuit 214 includes additional PMOS transistors 400, 402, 404 configured as shown. Similarly, the pull down buffer circuit 216 includes additional NMOS transistors 406, 408, 410 configured as shown. In one embodiment, the combination of PMOS transistors 300, 302, 304 have a 150 Ohm impedance and the combination of PMOS transistors 400, 402, 404 have a 150 Ohm impedance. The combination of NMOS transistors 313, 315, 317 have a 75 Ohm impedance and the combination of NMOS transistors 406, 408, 410 have a 150 Ohm impedance. As such, in this example, the output voltage 218 varies from a high of 1.2V and to a low of 0 and has an effective output impedance of 50 Ohms. Accordingly, this configuration is suitable for DP AUX applications.

Figure 6:
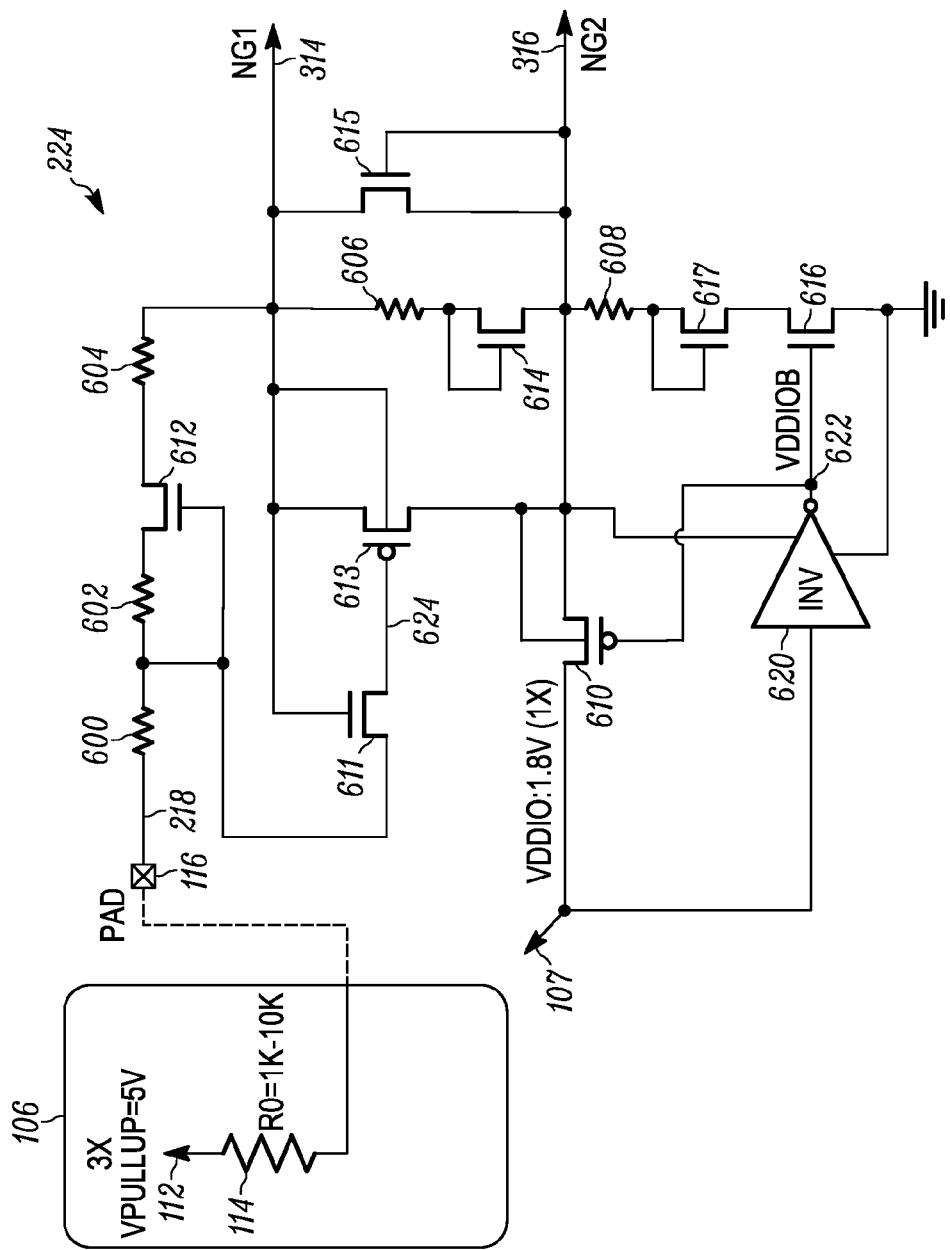
FIG. 6 is an exemplary diagram of a dynamic bias circuit of the input/output buffer circuit.

Referring now to FIG. 6, an exemplary diagram of the dynamic bias circuit 324 is depicted. The dynamic bias circuit 324 includes resistors 600, 602, 604, 606, 608, transistors 610, 611, 612, 613, 614, 615, 616, 617, and inverter 620 configured as shown. In this example, transistors 611, 612, 614, 615, 616, 617 are NMOS transistors and transistors 610, 613 are PMOS transistors. In one embodiment, the resistance values of resistors 600, 602, 604, 606, 608 are 10 k Ohm, 10 k Ohm, 2.5 k Ohm, 25 k Ohm, 10 k Ohm, respectively. In addition, in one embodiment, transistors 611 and 615 have a lower threshold voltage than transistors 610, 612, 613, 614, 616, 617. Furthermore, transistor 611 is always on (e.g., in the saturation region) and traces the output voltage 218.

When in the first mode of operation (e.g., an open drain interfaces mode), voltage source 107 (e.g., 1.8V) is off and 3X (e.g., 5.0V) external pull up circuit 106 is on. Transistors 612, 614, 617 are on (e.g., in the saturation region) and transistors 613, 615 off (e.g., not in the saturation region).

Voltage 622 is high (e.g., 1.8V) and equal to the NG2 voltage 316. As such, transistor 616 is on and transistor 610 is off. In addition, the NG1 voltage 314 and the NG2 voltage 316 are generated from a voltage divider and are approximately 3.6V and 1.8V, respectively. If both voltage source 107 and the external pull up circuit 106 are on, voltage 622 is 0 and transistor 616 is off, transistor 610 is on and the NG2 voltage 316 is equal to that of voltage source 107. Accordingly, the NG2 voltage remains constant at 1X (e.g., 1.8V) of the output voltage 218. When the output voltage 218 is 3X (e.g., 5V), transistors 612, 614 on, transistors 613, 615 are off, and the NG1 voltage 314 and voltage 624 are at 2X (e.g., 3.6V). When the output voltage 218 is 0, transistors 612, 614 off, transistors 613, 615 are on, the NG1 voltage 314 is at 1X (e.g., 1.8V), and voltage 624 is at 0. In this example, the dynamic bias circuit 324 draw about 20-30 uA of current from the external pull up circuit 106 and the voltage drop across resistor 114 is 200 mv or less. As such, the voltage drop across resistor 144 is about 4% of the 3X pull up power and is therefore negligible.

When in the second and third modes of operation (e.g., low swing and rail-to-rail modes), the maximum output voltage 218 is equal or less than 1X Volts. Therefore, overstress voltage is not a concern and the NG1 voltage 314 and the NG2 voltage 314 remain constant at 1X Volts.

Figure 7:
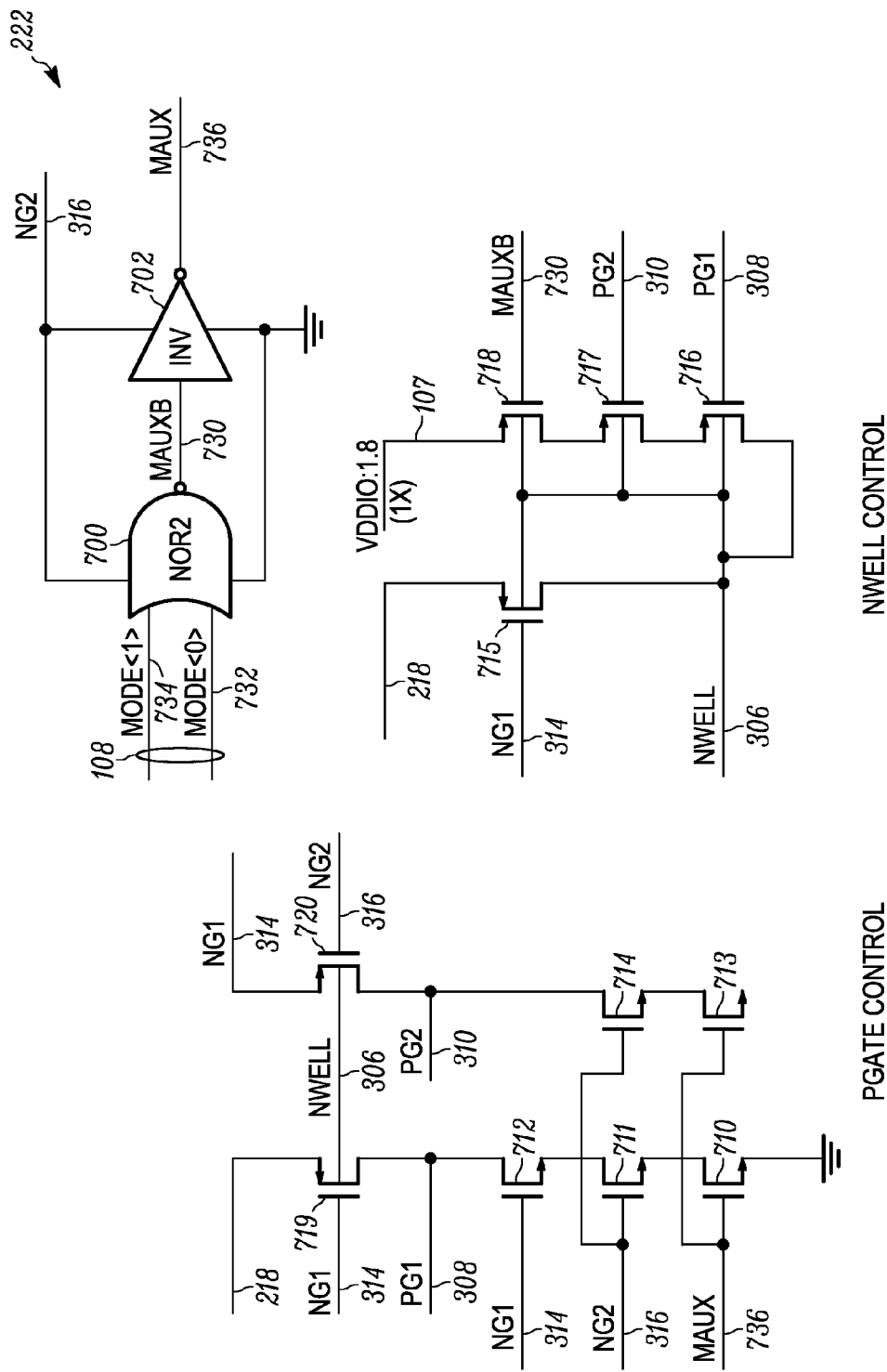
FIG. 7 is an exemplary diagram of a pull up control circuit of the input/output buffer circuit.

Referring now to FIG. 7, an exemplary diagram of the pull up control circuit 222 is depicted. The pull up control circuit 222 includes NOR gate 700, inverter 702, and transistors 710, 711, 712, 713, 714, 715, 716, 717, 718, 719, 720 configured as shown. NOR gate 700 provides voltage 730 in response to the mode control signal 108. In one example, the mode control signal 108 is a multiplexed signal comprising a first mode signal 732 and a second mode control signal 734. In response to voltage 730, the inverter 702 provides voltage 736.

When in the first mode (e.g., open drain mode), voltage 736 is at 0. Since voltage 736 is at 0, transistors 710, 713, 718 are off. When the output voltage 218 is high or at 3X Volt (e.g., 5V), transistors 715, 719, 720 on, the PG1 voltage 308 and Nwell voltage 306 are equivalent to the output voltage 218, and PG2 voltage 310 is equivalent to NG1 voltage level. When the output voltage 218 is at 0, transistors 715, 719, 720 are off and PG1 voltage 308 and PG2 voltage is floating. The Nwell voltage 306 is then charged up to the source voltage 107 via transistor 718 acting as a parasitic diode.

When in the second and third modes (e.g., low swing and rail-to-rail modes), voltage 736 is equivalent to the NG2 voltage 316 (e.g., 1X). As such, transistors 710, 711, 712, 713, 714, 716, 717, 718 are on and transistors 715, 719, 720 are off. Therefore, the PG1 voltage 308 and PG2 voltage 310 are at zero and the Nwell voltage 306 is 1X Volts.

Figure 8:
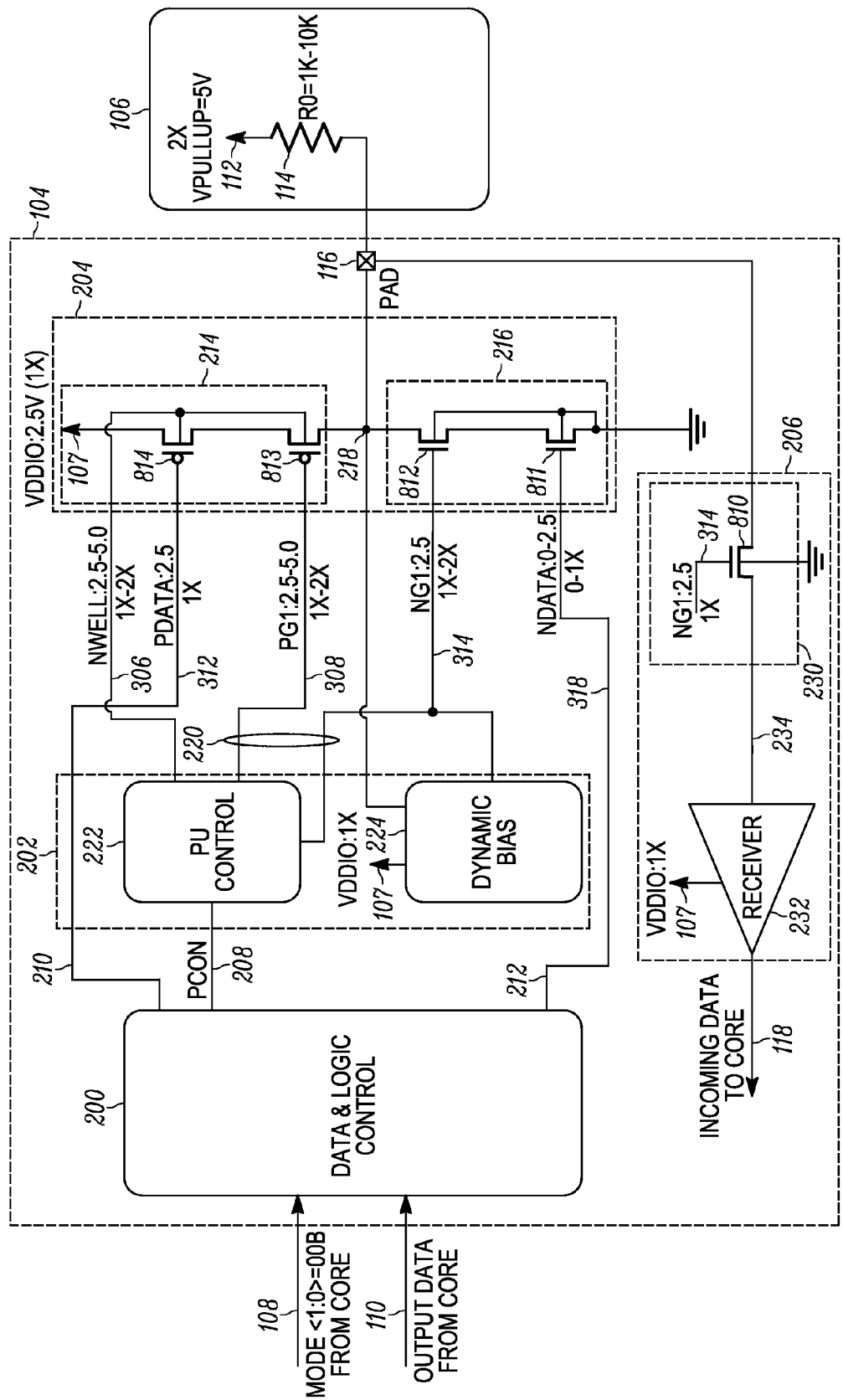
FIG. 8 is an alternative exemplary diagram of the input/output buffer circuit operating in the open drain mode.

Referring now to FIG. 8, an exemplary diagram of the input/output buffer circuit 104 that employs 1X transistors powered by voltage supply 107 (e.g., 2.5V) and supports the external pull up circuit 106 powered by a 2X voltage supply 112 (e.g., 5V). In this example, input/output buffer circuit 104 is in the first mode (e.g., open drain mode) and only bias signal NG1 voltage 314 is required. The NG1 voltage 314 is generated from the dynamic bias circuit 224 and remains constant at 1X (e.g., 2.5V).

The pull down buffer circuit 216 includes transistors 811, 812 configured as shown. In addition, the pull up buffer circuit 214 includes transistors 813, 814 configured as shown. Furthermore, the level shifter circuit 230 includes transistor 810 configured as shown. When transistor 813 is off, the Pdata voltage is fixed at 1X (e.g., 2.5V0. The PG1 voltage 308 and the Nwell voltage 306 dynamically trace the output voltage 218 to prevent circuitry of the input/output buffer circuit 104 from suffering from overstress voltage.

When the output voltage 218 is at 2X (e.g., 5V), the PG1 voltage 308 and the Nwell voltage 306 are both at 2X (e.g., 5V). When the output voltage 218 is at 0, the PG1 voltage 308 is floating and the Nwell voltage 306 lowers to 1X (e.g., 2.5V). Transistor 810 has a gate 820 operative to receive the NG1 voltage 314. As such, voltage level that can be transmitted to the receiver 232 varies from the NG1 voltage 314 to 0.

Figure 9:
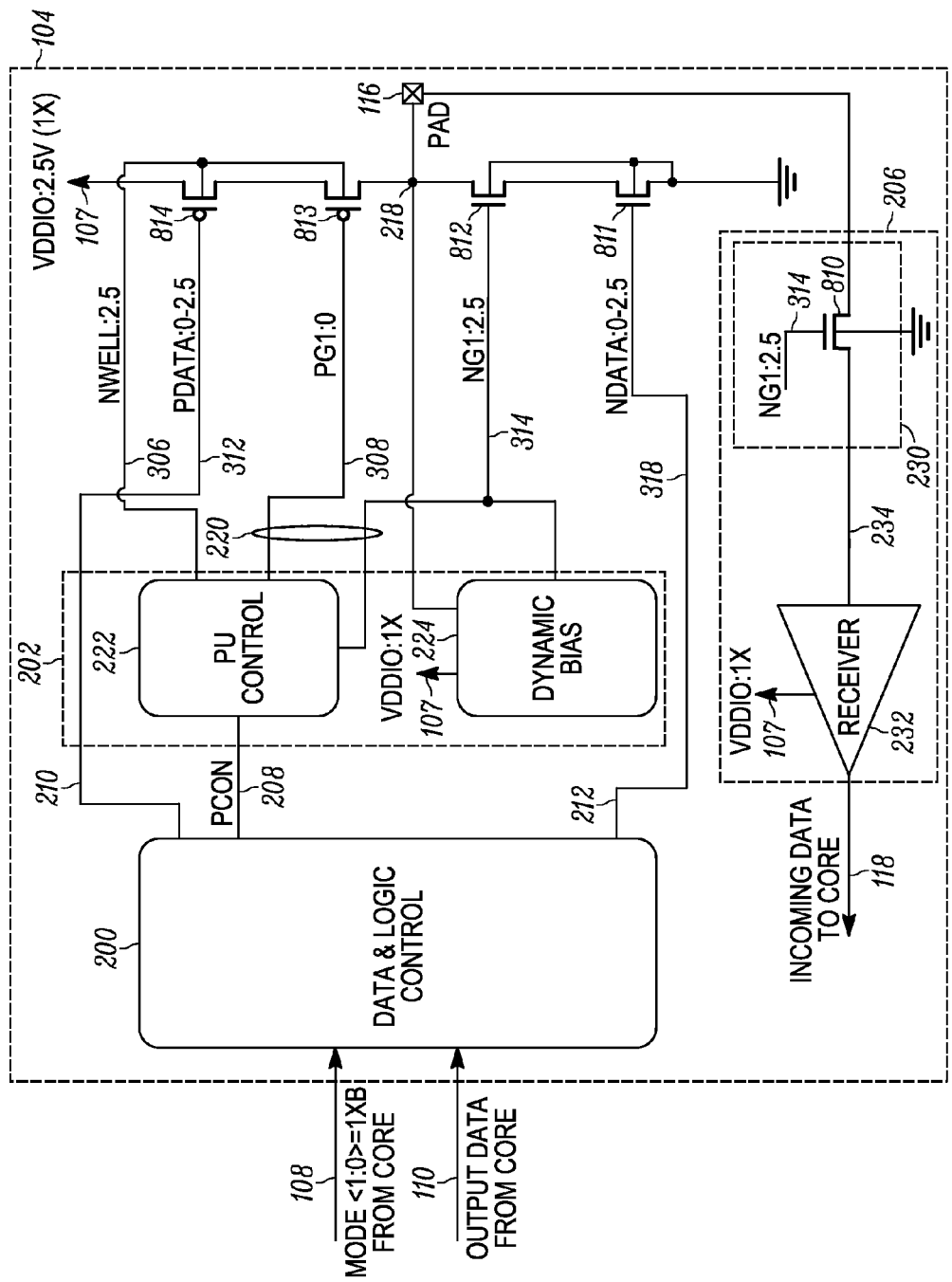
FIG. 9 is an alternative exemplary diagram of the input/output buffer circuit operating in the rail to rail mode.

Referring now to FIG. 9, an exemplary diagram of the input/output buffer circuit 104 operating in the second mode (e.g., rail to rail mode) is depicted. In this example, the input/output buffer circuit 104 employs 1X transistors powered by voltage source 107 providing 1X (e.g., 2.5V) and supporting external pull up circuit 106 where supply 112 is at 2X (e.g., 5V). In this example, the NG1 voltage 314 and the Nwell voltage 306 are both at 1X Volts (e.g., 2.5V) and the PG1 voltage 308 is at 0. The Pdata voltage 312 and Ndata voltage are transmitted having via the output voltage 218 having a swing of 0 to 1X Volts (e.g., 2.5V).

Figure 10:
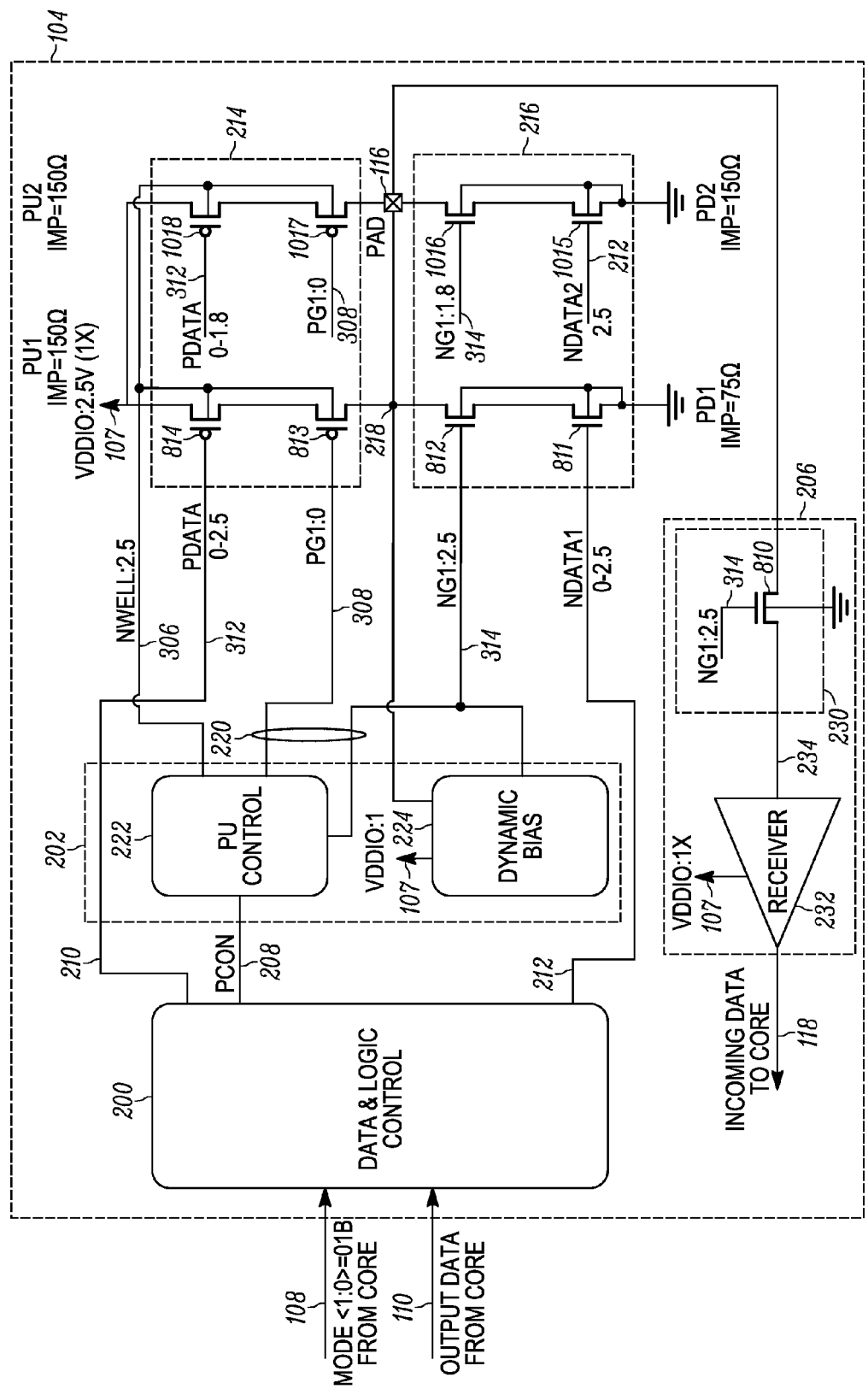
FIG. 10 is an alternative exemplary diagram of the input/output buffer circuit operating in the low swing output mode.

Referring now to FIG. 10, an exemplary diagram of the input/output buffer circuit 104 operating in the third mode (e.g., low swing output mode) is depicted. In this example, the pull down buffer circuit 216 includes additional NMOS transistors 1015, 1016 configured as shown. In addition, the pull up buffer circuit 214 includes additional PMOS transistors 1017, 1018 configured as shown. In one embodiment, the combination of PMOS transistors 813, 814 have a 150 Ohm impedance and the combination of PMOS transistors 1017, 1018 have a 150 Ohm impedance. The combination of NMOS transistors 811, 812 have a 75 Ohm impedance and the combination of NMOS transistors 1015, 1016 have a 150 Ohm impedance. As such, in this example, the output voltage 218 varies from a high of 1.2V and to a low of 0 and has an effective output impedance of 50 Ohms.

Figure 11:
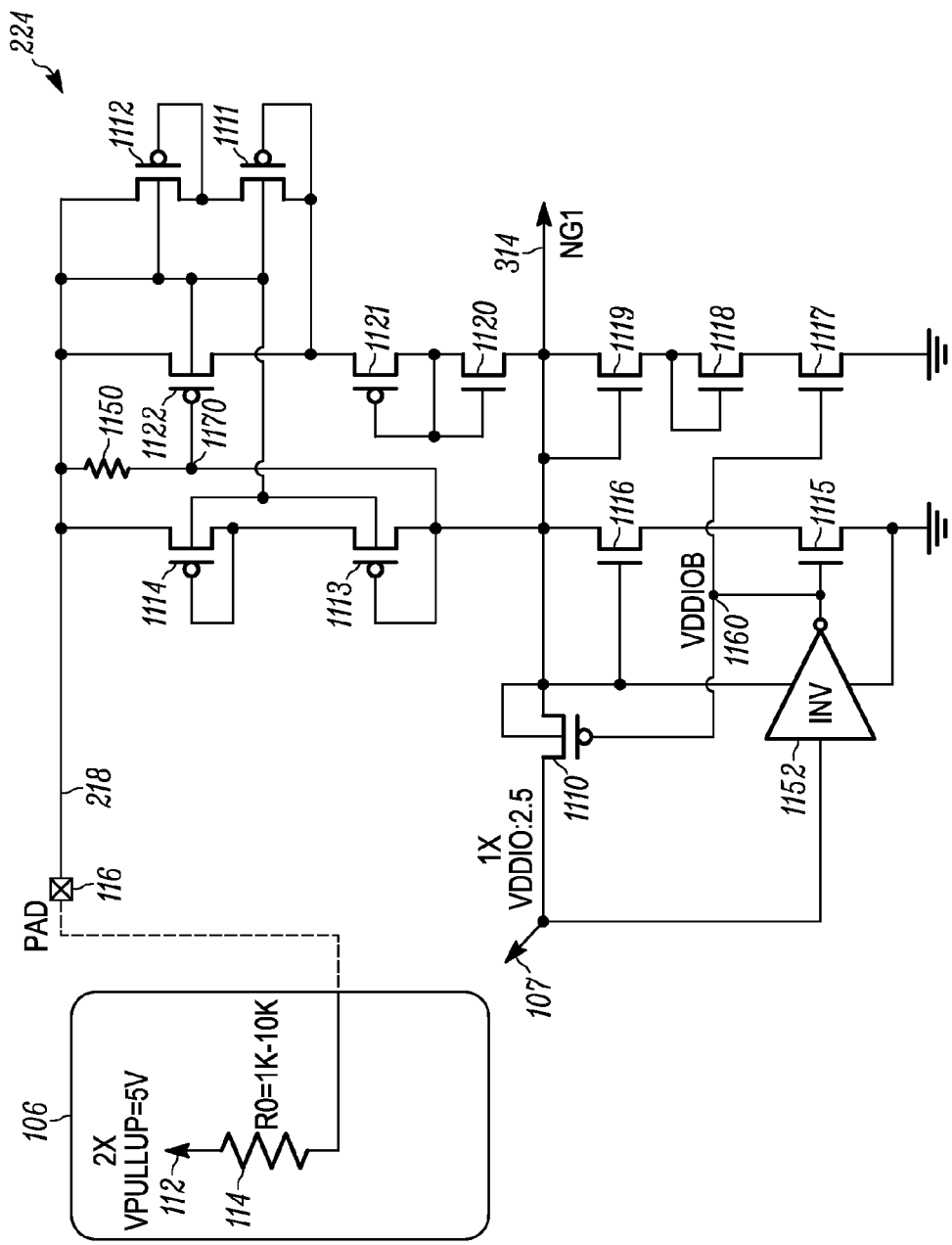
FIG. 11 is an alternative an exemplary diagram of the dynamic bias circuit.

Referring now to FIG. 11, an exemplary diagram of the dynamic bias circuit 224 is depicted. In this example, the 1X circuitry of the input/output buffer circuit 104 only need to 2X Volts rather than 3X Volts. In this embodiment, the dynamic bias circuit 224 includes transistors 1110, 1111, 1112, 1113, 1114, 1115, 1116, 1117, 1118, 1119, 1120, 1121, 1122, resistor 1150, and inverter 1152 configured as shown. In this embodiment, only the NG1 voltage 314 is generated and therefore does not consume DC current when voltage source 107 is on.

When in the first mode (e.g., open drain mode), transistors 1117, 1118, 1119, 1120, 1121, 1122 make up a voltage divider and therefore set the NG1 voltage 314 to 1X Voltage (e.g., 2.5V). In addition, transistors 1113, 1114, 1115, 1116 make up another voltage divider and provide bias transistor 1122. Transistors 1111, 1112 are used as a bypass circuit at start up. For example, if source voltage 107 is off and the external pull up circuit 106 is on, the dynamic bias circuit 224 draw approximately 20-30 uA of current from the external pull up circuit 106 and the voltage drop across resistor 114 is approximately 200 mv or less. As such, the output voltage 218 is approximately 4.8V.

Transistors 1113, 1114, 1116, 1118, 1119, 1120, 1121, 1122 are on. In addition, transistors 1111, 1112 on when the external pull up circuit 106 is initially powered on, but turn off over time. Voltage 1160 is high and equivalent to the NG1 voltage 314. Therefore, transistor 1115, 1117 are on and transistor 1110 is off. The NG1 voltage 314 is derived from the voltage divider and is approximately 1X Volts (e.g., 2.5V).

If both voltage source 107 and the external pull up circuit 106 are on, voltage 1160 is 0 and transistors 1115, 1117 are off. Therefore, the two voltage dividers are off and no current is drawn from the external pull up circuit 106. Transistor 1110 is on and the NG1 voltage 314 is equivalent to that of voltage source 107. As such, the NG1 remains constant at 1X Volts (e.g., 2.5V) regardless of the output voltage 218. Voltage 1170 is asserted by resistor 1150 so that transistors 1113, 1114, 1122 can avoid a potential overstress voltage.

When in the second and third modes (e.g., the rail to rail and low swing modes), maximum value of the output voltage 218 is equal to or less than 1X Volts. Therefore, overstress voltage is not concerned for all devices As such, the NG1 voltage 314 remains at 1X Volts (e.g., 2.5V) in these modes.

Figure 12:
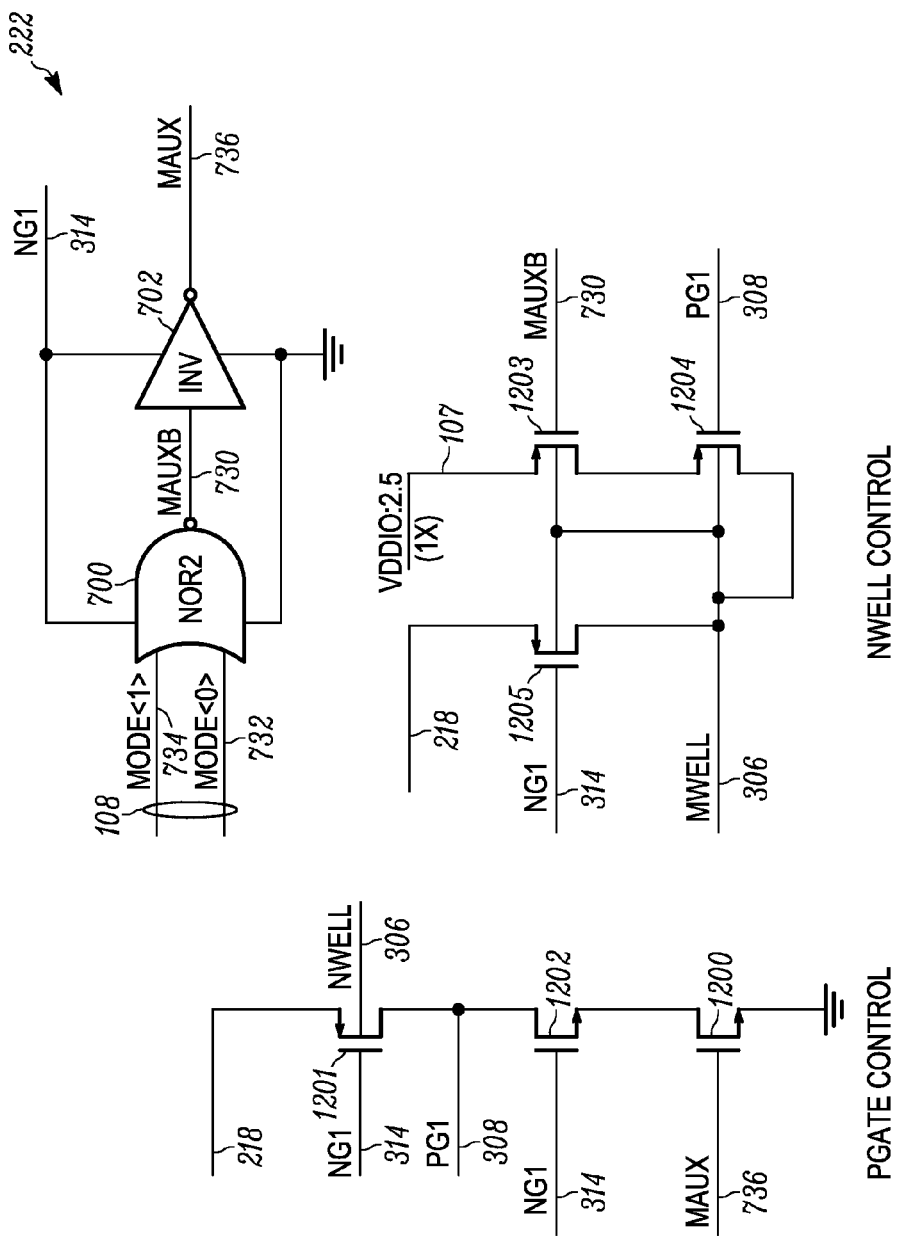
FIG. 12 is an alternative exemplary diagram of the pull up control circuit.

Referring now to FIG. 12, an exemplary diagram of the pull up control circuit 222 is depicted. In this example, the pull up control circuit 222 includes NOR gate 700, inverter 702, and transistors 1200, 1201, 1202, 1203, 1204, 1205 configured as shown. NOR gate 700 provides voltage 730 in response to the mode control signal 108. In one example, the mode control signal 108 is a multiplexed signal comprising a first mode signal 732 and a second mode control signal 734. In response to voltage 730, the inverter 702 provides voltage 736.

When in the first mode (e.g., open drain mode), voltage 736 is at 0 and transistors 1200, 1203 are off. When the output voltage 218 is at high (e.g., at 2X Volts), transistors 1201, 1205 are on. As such, the PG1 voltage 308 and the Nwell voltage 306 are equivalent to the output voltage 218. When the output voltage 218 is 0, transistors 1201, 1205 are off and the PG1 voltage 308 is floating. Accordingly, the Nwell voltage will charge up to that of voltage source 107 via transistor 1203 acting as a parasitic diode.

When in the second and third modes (e.g., rail to rail and low swing modes), voltage 736 is equivalent to the NG1 voltage 314, transistors 1200, 1202, 1203, 1204 are on, and transistors 1201, 1205 are off. Therefore, the PG1 voltage is zero and the NG1 voltage 314 and Nwell voltage 306 are at 1X Volts (e.g., 2.5V).

Figure 13:
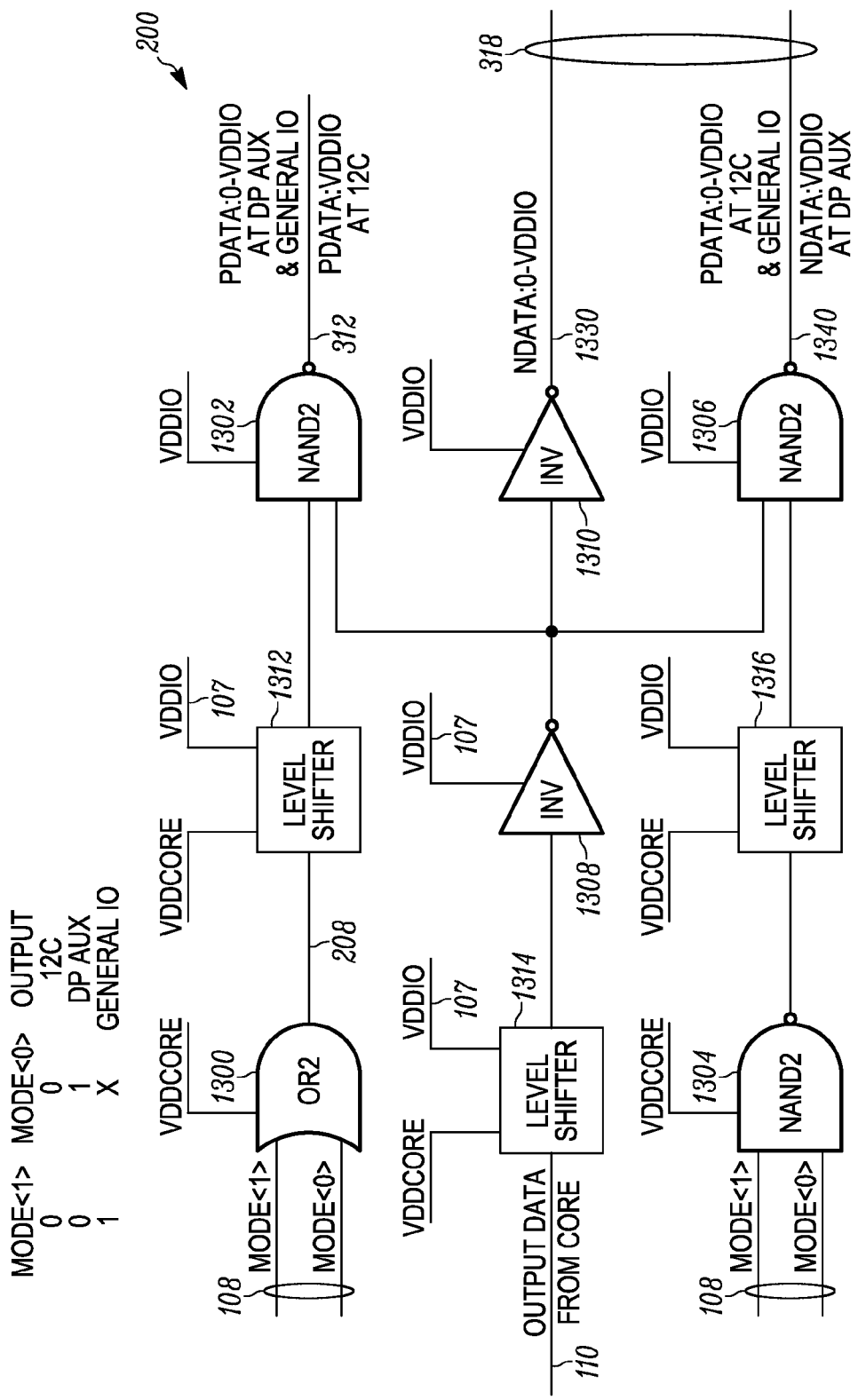
FIG. 13 is an exemplary diagram of a data and logic control circuit of the input/output buffer circuit.

Referring now to FIG. 13, an exemplary diagram of the data and logic control circuit 200 is depicted. In this example, the data and logic control circuit 200 includes OR gate 1300, NAND gates 1302, 1304, 1304, inverters 1308, 1310, and level shifters 1312, 1314, 1316 configured as shown.

When the input/output buffer circuit 104 is configured in the first mode (e.g., I²C mode), the Pdata voltage 312 output is always high (e.g., that of source voltage 107) and the Ndata voltage 318 varies from 0 to that of source voltage 107. When the input/output buffer circuit 104 is configured in the second mode (e.g., DP AUX mode), the Pdata voltage 312 varies from 0 to that of source voltage 107, and Ndata voltage 1330 varies from 0 to that of source voltage 107 and Ndata voltage 1340 remains high (e.g., that of source voltage 107). When the buffers are configured in the third mode (e.g., General IO mode), the Pdata voltage 312 varies from 0 to that of source voltage 107, and Ndata voltages 1330, 1340 also vary from 0 to that of source voltage 107.

As noted above, among other advantages, circuit provides tolerance to higher voltages on, for example, an input/output pad without the need for external level shifters. In addition, the circuit has a single I/O pad that can be configured to support multiple functions, such as three functions for example. Other advantages will be recognized by those of ordinary skill in the art.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims. In addition, unless stated otherwise, terms such as "first" and "second" are used to arbitrarily distinguish between the elements such terms describe. Thus, these terms are not necessarily intended to indicate temporal or other prioritization of such elements. The term coupled, as used herein, is defined as connected, although not necessarily directly, and not necessarily mechanically. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one.

What is claimed is:

1. A circuit comprising:
    an input/output buffer circuit comprising:
        an output buffer circuit that is operative to receive output information and an output buffer bias voltage and to provide an output voltage in response to the output information and the output buffer bias voltage; and
        a bias control circuit that is operative to provide the output buffer bias voltage based on the output voltage and not based on the output information.

2. The circuit of claim 1 wherein the bias control circuit comprises:
    a dynamic bias circuit that is operative to provide a first bias voltage of the output buffer bias voltage based on the output voltage; and
    a pull up control circuit that is operative to provide a second bias voltage of the output buffer bias voltage based on the first bias voltage, wherein the output voltage is based on the output information.

3. The circuit of claim 2 wherein the input/output buffer circuit is configured to be operatively powered by a first voltage and is operative to selectively operate in at least one of a first mode, a second mode, or a third mode in response to a mode control signal, wherein: a second voltage of the input/output node is greater than the first voltage when in the first mode, the second voltage of the input/output node is approximately equal to the first voltage when in the second mode, and the second voltage of the input/output node is less than the first voltage when in the third mode.

4. The circuit of claim 2 wherein the output buffer circuit comprises:
    a pull up buffer circuit that is operative to provide the output voltage based on the first bias voltage; and
    a pull down buffer circuit that is operative to provide the second voltage based on the second bias voltage.

5. The circuit of claim 1 further comprising a level shifter circuit that is operative to provide input information in response to the output voltage and the output buffer bias voltage.

6. The circuit of claim 3 wherein:
    the first bias voltage varies between the first voltage and twice the first voltage when in the first mode; and
    the second bias voltage is approximately equal to the first voltage when in the second mode and the third mode.

7. The circuit of claim 6 wherein at least one of: the second bias voltage varies between the first voltage and twice the first voltage when in the first mode and the second bias voltage is approximately equal to the first voltage when in the first mode.

8. The circuit of claim 1 wherein the circuit is an integrated circuit and further comprises at least one processor that is operative to provide the mode control signal and the output information.

9. An apparatus comprising:
at least one processor that is operative to provide a mode control voltage and output information; and
an input/output buffer circuit comprising:
an output buffer circuit that is operative to receive the output information and an output buffer bias voltage and to provide an output voltage in response to the output information and the output buffer bias voltage; and
a bias control circuit that is operative to provide the output buffer bias voltage based on the output voltage and not based on the output information.

10. The apparatus of claim 9 wherein the bias control circuit comprises:
a dynamic bias circuit that is operative provide a first bias voltage of the output buffer bias voltage based on the output voltage; and
a pull up control circuit that is operative to provide a second bias voltage of the output buffer bias voltage based on the first bias voltage, wherein the output voltage is based on the output information.

11. The apparatus of claim 10 wherein the input/output buffer circuit is configured to be operatively powered by a first voltage and is operative to selectively operate in at least one of a first mode, a second mode, or a third mode in response to a mode control signal, wherein: a second voltage of the input/output node is greater than the first voltage when in the first mode, the second voltage of the input/output node is approximately equal to the first voltage when in the second mode, and the second voltage of the input/output node is less than the first voltage when in the third mode.

12. The apparatus of claim 10 wherein the output buffer circuit comprises:
a pull up buffer circuit that is operative provide the output voltage based on the first bias voltage; and
a pull down buffer circuit that is operative to provide the second voltage based on the second bias voltage.

13. The apparatus of claim 9 further comprising a level shifter circuit that is operative to provide input information in response to the output voltage and the output buffer bias voltage.

14. The apparatus of claim 11 wherein:
the first bias voltage varies between the first voltage and twice the first voltage when in the first mode; and
the second bias voltage is approximately equal to the first voltage when in the second mode and the third mode.

15. A computer readable medium comprising information that when executed by at least one processor causes the at least one processor to:
at least one of: operate, design, and organize a circuit that comprises:
an input/output buffer circuit comprising:
an output buffer circuit that is operative to receive output information and an output buffer bias voltage and to provide an output voltage in response to the output information and the output buffer bias voltage; and
a bias control circuit that is operative to provide the output buffer bias voltage based on the output voltage and not based on the output information.

16. The computer readable medium of claim 15 wherein the bias control circuit comprises:
a dynamic bias circuit that is operative provide a first bias voltage of the output buffer bias voltage based on the output voltage; and
a pull up control circuit that is operative to provide a second bias voltage of the output buffer bias voltage based on the first bias voltage, wherein the output voltage is based on the first bias voltage and the second bias voltage.

17. The computer readable medium of claim 16 wherein the input/output buffer circuit is configured to be operatively powered by a first voltage and is operative to selectively operate in at least one of a first mode, a second mode, or a third mode in response to a mode control signal, wherein: a second voltage of the input/output node is greater than the first voltage when in the first mode, the second voltage of the input/output node is approximately equal to the first voltage when in the second mode, and the second voltage of the input/output node is less than the first voltage when in the third mode.

18. The computer readable medium of claim 16 wherein the output buffer circuit comprises:
a pull up buffer circuit that is operative provide the output voltage based on the first bias voltage; and
a pull down buffer circuit that is operative to provide the second voltage based on the second bias voltage.

19. The computer readable medium of claim 15 further comprising a level shifter circuit that is operative to provide input information in response to the output voltage and the output buffer bias voltage.

20. The computer readable medium of claim 17 wherein:
the first bias voltage varies between the first voltage and twice the first voltage when in the first mode; and
the second bias voltage is approximately equal to the first voltage when in the second mode and the third mode.

21. The circuit of claim 1 wherein the input/output buffer circuit is configured to be operatively powered by a first voltage and is operative to selectively operate in at least one of a first mode, a second mode, or a third mode in response to a mode control signal, wherein the mode control signal is based on the output voltage and is provided to the bias control circuit to select the at least one of the first mode, the second mode, or the third mode.

22. The apparatus of claim 9 wherein the input/output buffer circuit is configured to be operatively powered by a first voltage and is operative to selectively operate in at least one of a first mode, a second mode, or a third mode in response to the mode control voltage, wherein the mode control voltage is based on the output voltage and is provided to the bias control circuit to select the at least one of the first mode, the second mode, or the third mode.

23. The computer readable medium of claim 15 wherein the input/output buffer circuit is configured to be operatively powered by a first voltage and is operative to selectively operate in at least one of a first mode, a second mode, or a third mode in response to a mode control signal, wherein the mode control signal is based on the output voltage and is provided to the bias control circuit to select the at least one of the first mode, the second mode, or the third mode.

* * * * *